US008580034B2

(12) United States Patent
Leusink

(10) Patent No.: US 8,580,034 B2
(45) Date of Patent: Nov. 12, 2013

(54) LOW-TEMPERATURE DIELECTRIC FORMATION FOR DEVICES WITH STRAINED GERMANIUM-CONTAINING CHANNELS

(75) Inventor: Gert Leusink, Saltpoint, NY (US)

(73) Assignee: Tokyo Electron Limited, Tokyo (JP)

( * ) Notice: Subject to any disclaimer, the term of this patent is extended or adjusted under 35 U.S.C. 154(b) by 1488 days.

(21) Appl. No.: 11/393,737

(22) Filed: Mar. 31, 2006

(65) Prior Publication Data

US 2007/0238268 A1  Oct. 11, 2007

(51) Int. Cl.
*C30B 21/02* (2006.01)

(52) U.S. Cl.
USPC .......... 117/84; 117/89; 117/88; 117/92; 117/95; 117/103

(58) Field of Classification Search
USPC .............. 117/3, 84, 88, 89, 92, 95, 103
See application file for complete search history.

(56) References Cited

U.S. PATENT DOCUMENTS

| 6,059,895 | A  | 5/2000  | Chu et al.      |
|-----------|----|---------|-----------------|
| 6,812,116 | B2 | 11/2004 | Huang et al.    |
| 6,897,149 | B2 | 5/2005  | Sugawara et al. |
| 6,906,398 | B2 | 6/2005  | Yeo et al.      |
| 2004/0048452 | A1 | 3/2004 | Sugawara et al. |
| 2004/0142577 | A1 | 7/2004 | Sugawara et al. |
| 2005/0176263 | A1 | 8/2005 | Sugawara et al. |
| 2005/0214997 | A1 | 9/2005 | Tweet et al.    |
| 2005/0233599 | A1 | 10/2005 | Sugawara et al. |
| 2006/0001088 | A1 | 1/2006 | Chan et al.     |

OTHER PUBLICATIONS

Tejas Krishnamohan, et al., "Low Defect Ultra-thin Fully Strained-Ge MOSFET on Relaxed Si with High Mobility and Low Band-To-Band-Tunneling (BTBT)", Symposium on VLSI Technology Digest of Technical Papers, 2005, pp. 82-83.
O. Weber, et al., "Strained Si and Ge MOSFETs with High-K/Metal Gate Stack for High Mobility Dual Channel CMOS", IEDM, Tech. Dig., 2005, pp. 1-4.
Andrieu et al., "SiGe Channel p-MOSFETs Scaling-Down," 33rd European Solid-State Device Research Conference, Sep. 16-18, 2003, Estoril, Portugal, pp. 267-270.
Notification of Examination Opinion issued Jun. 17, 2011, in Taiwan Patent Application No. 096110743, with English Translation.

*Primary Examiner* — Bob M Kunemund
(74) *Attorney, Agent, or Firm* — Oblon, Spivak, McClelland, Maier & Neustadt, L.L.P.

(57) ABSTRACT

A method of forming a semiconductor device includes providing a substrate in a vacuum processing tool, the substrate having a strained Ge-containing layer on the substrate and a Si layer on the strained Ge-containing layer, maintaining the substrate at a temperature less than 700° C., and generating a soft plasma in the vacuum processing tool. The Si layer is exposed to the soft plasma to form a Si-containing dielectric layer while minimizing oxidation and strain relaxation in the underlying strained Ge-containing layer. A semiconductor device containing a substrate, a strained Ge-containing layer on the substrate, and an Si-containing dielectric layer formed on the strained Ge-containing layer is provided. The semiconductor device can further contain a gate electrode layer on the Si-containing dielectric layer or a high-k layer on the Si-containing dielectric layer and a gate electrode layer on the high-k layer.

14 Claims, 6 Drawing Sheets

LOW-TEMPERATURE DIELECTRIC FORMATION FOR DEVICES WITH STRAINED GERMANIUM-CONTAINING CHANNELS

FIELD OF THE INVENTION

The present invention relates to semiconductor processing and semiconductor devices containing silicon-containing dielectric layers overlying strained germanium-containing channels.

BACKGROUND OF THE INVENTION

In semiconductor devices, strained germanium (s-Ge), strained silicon (s-Si), and strained silicon germanium (s-SiGe) layers are very promising as future transistor channel materials. Devices such as metal oxide semiconductor field effect transistors (MOSFETs) have been experimentally demonstrated to exhibit enhanced device performance compared to devices fabricated using conventional (unstrained) silicon substrates. Potential performance improvements include increased device drive current and transconductance, as well as the added ability to scale the operation voltage, without sacrificing circuit speed, in order to reduce power consumption.

In general, formation of strained layers is the result of strain induced in these layers when they are grown on a substrate formed of a crystalline material whose lattice constant is greater or smaller than that of the strained layers. The lattice constant of Ge is about 4.2 percent greater than that of Si, and the lattice constant of a SiGe alloy is linear with respect to its Ge concentration. In one example, the lattice constant of a SiGe alloy containing fifty atomic percent Ge is about 1.02 times greater than the lattice constant of Si.

Overlying the channel material in a MOSFET is a gate dielectric material, and a gate electrode material overlies the gate dielectric material. The gate dielectric material can include a Si-containing dielectric layer such as a $SiO_2$, SiON, or SiN dielectric layers, either used alone as a gate dielectric layer or as an interfacial layer in combination with a high-k dielectric material that offers improved gate leakage properties. Many high-k dielectric materials have poor interface properties compared to Si-containing dielectric layers, particularly oxidized Si layers and therefore an ultra thin oxidized Si-containing interfacial layer is typically inserted below the high-k dielectric material above the channel material.

Current methods for forming Si-containing dielectric layers such as ultra thin oxidized Si layers typically require high temperature oxidation processes in order to achieve the desired electrical properties of the ultra thin oxidized Si layers. Currently, substrate temperatures above 700° C. are required, for example substrate temperatures of 800° C. or higher. Such high substrate temperatures have been observed to result in defect formation due to at least partial strain relaxation in strained Ge-containing channel materials such as Ge and SiGe, and/or partial oxidation of the strained Ge-containing layer. Furthermore, since the ultra thin oxidized Si layers can be only a few monolayers thick, the strained Ge-containing layers underneath the oxidized Si layer may be damaged by highly energetic plasma species during conventional plasma oxidation.

SUMMARY OF THE INVENTION

Accordingly, one aspect of the invention is to minimize any of the above-described and/or other problems relating to strained Ge-containing methods or devices.

Another object of the invention is to provide a low temperature dielectric-forming process that minimizes oxidation and strain relaxation in the strained Ge-containing layers, without conventional plasma damage to the underlying strained Ge layer.

These and/or other objectives may be achieved by embodiments of the invention, which may provide a low temperature plasma process for forming Si-containing dielectric layers such as $SiO_2$, SiON, or SiN dielectric layers for devices containing strained Ge-containing materials. The Ge-containing materials can include Ge and SiGe layers. The plasma process uses a soft plasma and substrate temperatures below 700° C. which can form highly uniform, ultra thin Si-containing dielectric layers with excellent dielectric properties, while minimizing oxidation and strain relaxation in the underlying strained Ge-containing layer. The ultra thin Si-containing dielectric layers can either be used alone as gate dielectric layers or as interfacial layers in combination with a high-k dielectric material in a device.

Thus, according to one embodiment of the invention, the method includes providing a substrate in a vacuum processing tool, the substrate having a strained Ge-containing layer on the substrate and a Si layer on the strained Ge-containing layer, maintaining the substrate at a temperature less than 700° C., and generating a soft plasma in the vacuum processing tool. The Si layer is exposed to the soft plasma to form a Si-containing dielectric layer while minimizing oxidation and strain relaxation in the underlying strained Ge-containing layer.

According to another embodiment of the invention, a semiconductor device is provided that includes a substrate, a strained Ge-containing layer on the substrate, a Si-containing dielectric layer formed on the strained Ge-containing layer, wherein the Si-containing dielectric layer is formed by exposing a silicon layer overlying the strained Ge-containing layer to a soft plasma at a substrate temperature less than 700° C. that minimizes oxidation and strain relaxation in the underlying strained Ge-containing layer. The semiconductor device can further contain a gate electrode layer on the Si-containing dielectric layer or a high-k layer on the Si-containing dielectric layer and a gate electrode layer on the high-k layer.

DETAILED DESCRIPTION OF SEVERAL EMBODIMENTS OF THE INVENTION

Figure 1A:
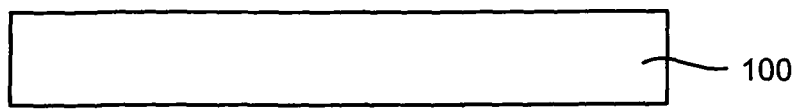
FIGS. 1A-1E schematically show cross-sectional device views corresponding to processing steps used in forming a semiconductor device containing a strained Ge-containing layer according to an embodiment of the invention.

Embodiments of the invention provide a method for forming high performance devices that contain ultra thin Si-containing dielectric layers formed over strained Ge-containing materials. The Si-containing dielectric layers can, for example, either be used alone as gate dielectric layers or as interfacial layers in combination with high-k dielectric materials. According to one embodiment of the invention, the Si-containing dielectric layer can include $SiO_2$, SiON, or SiN, or a combination thereof.

In the figures described below, for ease of reference, common reference numerals are used throughout the figures when referring to the same or similar features common to the figures.

FIGS. 1A-1E schematically show cross-sectional device views corresponding to processing steps used in forming a semiconductor device containing a strained Ge-containing layer according to an embodiment of the invention. In FIG. 1A, the substrate (wafer) 100 can be of any size, for example a 200 mm substrate, a 300 mm substrate, or an even lager substrate. In one example, the substrate can be a n-type Si substrate. According to one embodiment of the invention, the substrate 100 may contain a SiGe buffer layer.

Figure 1B:

FIG. 1B shows a strained Ge-containing layer 102 formed over the substrate 100. The strained Ge-containing layer 102 can be a Ge layer, or a $Si_xGe_{1-x}$ layer where x is the atomic fraction of Si and 1−x is the atomic fraction of Ge. As used herein, "SiGe" refers to $Si_xGe_{1-x}$ alloys where $0.1 \leq 1-x < 1$. Exemplary $Si_xGe_{1-x}$ alloys include $Si_{0.1}Ge_{0.9}$, $Si_{0.2}Ge_{0.8}$, $Si_{0.3}Ge_{0.7}$, $Si_{0.4}Ge_{0.6}$, $Si_{9.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. The strained Ge-containing layer 102 can have, for example, a thickness between about 1 nm and about 20 nm, or between about 5 nm and about 10 nm. In one example, the strained Ge-containing layer 102 can be a compressive-strained Ge layer or a tensile-strained $Si_xGe_{1-x}$ (x>0.5) deposited on a relaxed $Si_{0.5}Ge_{0.5}$ buffer layer.

Figure 1C:
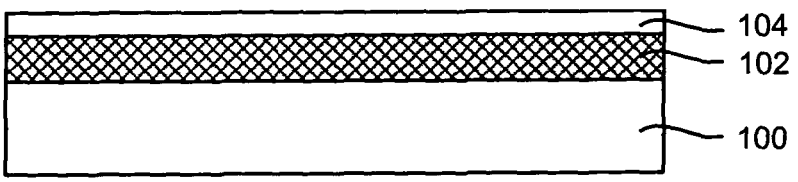

FIG. 1C shows a Si layer 104 formed over the strained Ge-containing layer 102 on the substrate 100. The Si layer 104 can, for example, have a thickness between about 0.3 nm and about 2 nm, or between about 0.5 nm and about 1 nm. Depending on the Si formation or deposition conditions, the Si layer 104 can be crystalline, polycrystalline, or amorphous. According to one embodiment of the invention, the Si layer 104 can be a tensile-strained Si layer.

Figure 1D:
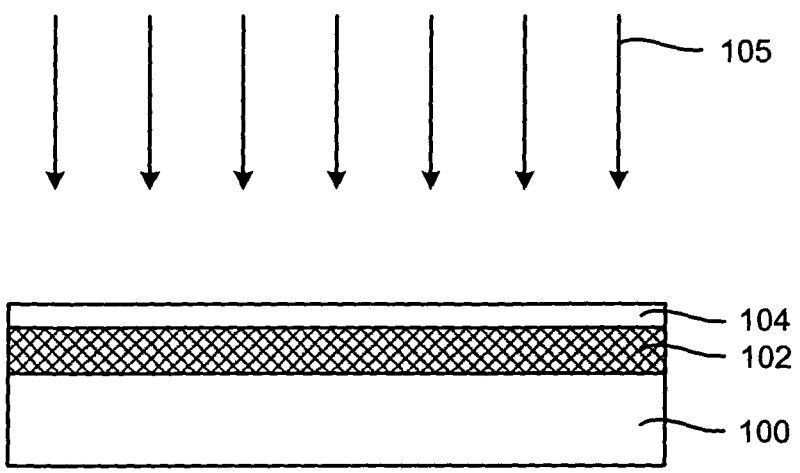
Figure 1E:
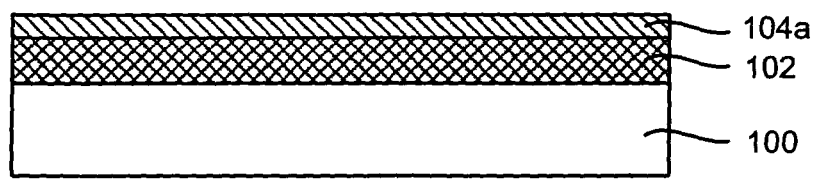

FIG. 1D shows the Si layer 104 depicted in FIG. 1C exposed to a soft plasma 105 to form the Si-containing dielectric layer 104a while maintaining the substrate 100 at a temperature less than 700° C. The soft plasma exposure may be performed by utilizing a plasma processing system containing a slot plane antenna plasma source as described in FIG. 5. The plasma process can use a low electron energy, high density plasma that is effective in forming a Si-containing dielectric layer 104a depicted in FIG. 1E without substantially oxidizing or relaxing the underlying strained Ge-containing layer 102. It is contemplated that the dielectric forming process may oxidize or nitride the entire vertical thickness of the Si layer 104 but this is not required as partial oxidation or nitridation of the entire vertical thickness of the Si layer 104 may occur. Furthermore, as those skilled in the art will readily recognize, elemental composition throughout the formed Si-containing dielectric layer 104a may not be uniform but may instead have a vertical composition profile. In one example, different elements within the layer 104a may have different vertical composition profiles. The Si-containing dielectric layer 104a may have a thickness between about 0.3 nm and about 2 nm, or between about 0.5 nm and about 1 nm.

According to one embodiment of the invention, the Si-containing dielectric layer 104a can be an oxide layer containing Si and O, an oxynitride layer containing Si, O, and N, or a nitride layer containing Si and N. According to one embodiment of the invention, the Si-containing dielectric layer 104a can be an oxide layer such as a $SiO_x$ layer where $x \leq 2$. In one example, the Si-containing dielectric layer 104a can be $SiO_2$. In another example, the Si-containing dielectric layer 104a can be a $SiO_x$ layer where $1 < x < 2$. According to another embodiment of the invention, the Si-containing dielectric layer 104a may be an oxynitride layer such as a $SiO_xN_y$ layer. In one example, a composition of the $SiO_xN_y$ layer may include $0 < x \leq 2$ and $0 < y \leq 0.25$. According to yet another embodiment of the invention, the Si-containing dielectric layer 104a can be a $Si_xN_y$ layer. A composition of the $Si_xN_y$ layer may include $x \leq 3$ and $y \leq 4$, for example a fully nitrided $Si_3N_4$ layer. In summary, the Si-containing dielectric layer 104a may contain $SiO_x$, $SiO_xN_y$, or $Si_xN_y$ dielectric layers, or a combination thereof. As used herein, these dielectric layers will be referred to as $SiO_2$, SiON, or SiN dielectric layers, respectively.

The choice between a $SiO_2$, SiON, or SiN dielectric layer in a device can depend on the electrical properties that are desired and materials compatibility with high-k materials. For example, $SiO_2$ dielectric layers are traditionally observed to have better electric properties than SiON dielectric layers, but SiON and SiN dielectric layers can be better diffusion barriers and can have a higher dielectric constant than $SiO_2$ dielectric layers, thereby increasing the overall dielectric constant of the gate stack, at the expense of reduced electron mobility in the device.

Figure 2A:
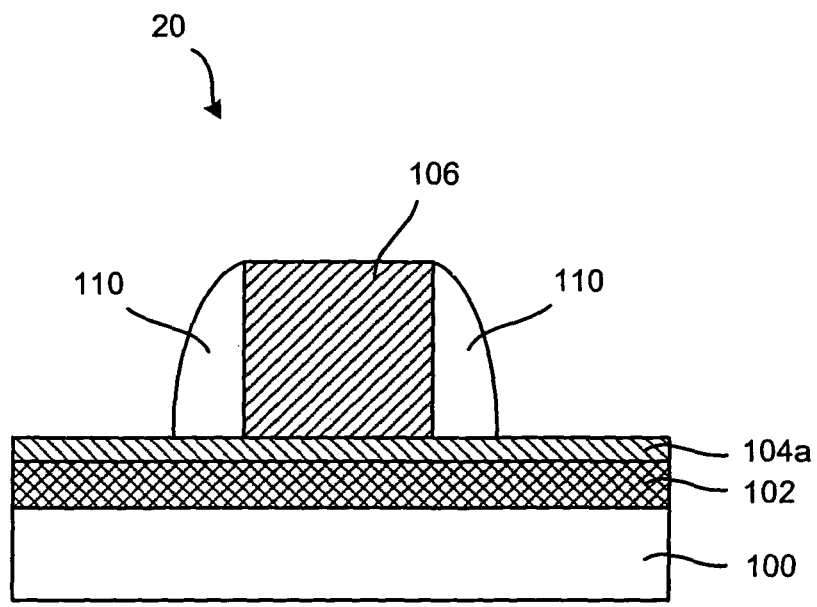
FIGS. 2A and 2B schematically show cross-sectional views of semiconductor devices containing strained Ge-containing layers according to embodiments of the invention.
Figure 2B:
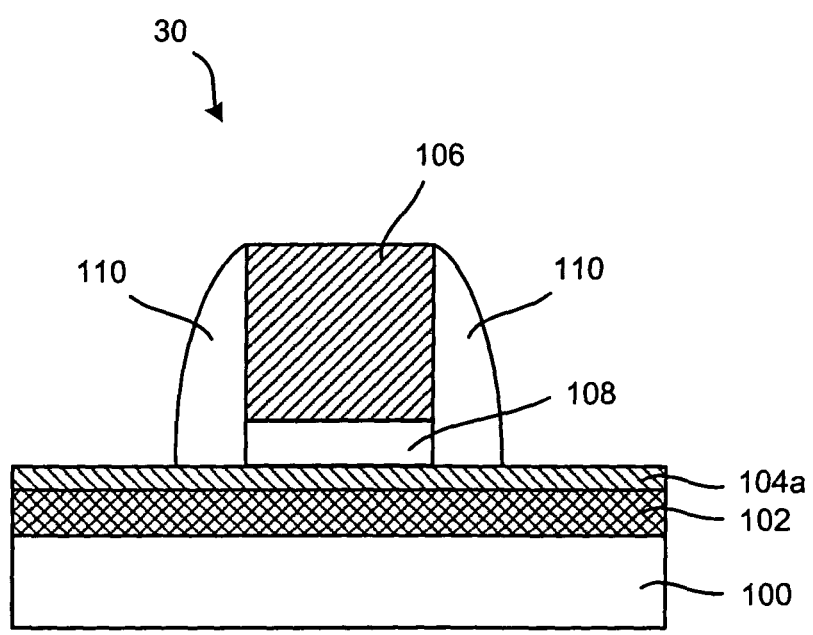

FIGS. 2A and 2B schematically show cross-sectional views of semiconductor devices containing strained Ge-containing layers according to embodiments of the invention. In the schematic cross-sectional views in FIGS. 2A and 2B, source and drains regions of the MOSFETs 20, 30 are not shown. FIG. 2A shows a cross-sectional view of a MOSFET 20 containing a gate electrode layer 106 on the Si-containing dielectric layer 104a, and oxide spacer 110.

FIG. 2B shows a cross-sectional view of a MOSFET 30 containing a high-k dielectric layer 108 over the Si-containing dielectric layer 104a, a gate electrode layer 106 over the high-k layer 108, and oxide spacer 110. The high-k dielectric layer 108 can, for example, contain a metal oxide or a metal silicate, including $Ta_2O_5$, $TiO_2$, $ZrO_2$, $Al_2O_3$, $Y_2O_3$, $HfSiO_x$, $HfO_2$, $ZrO_2$, $ZrSiO_x$, $TaSiO_x$, $SrO_x$, $SrSiO_x$, $LaO_x$, $LaSiO_x$, $YO_x$, or $YSiO_x$, or combinations of two or more thereof. The thickness of the high-k dielectric layer 108 can, for example, be between about 2 nm and about 20 nm, and can be about 4 nm.

The gate electrode layer 106 can, for example, be about 10 nm thick and can contain poly-Si, a metal, or a metal-containing material, including W, WN, $WSi_x$, Al, Mo, Ta, TaN, TaSiN, HfN, HfSiN, Ti, TiN, TiSiN, Mo, MoN, Re, Pt, or Ru.

Figure 3:
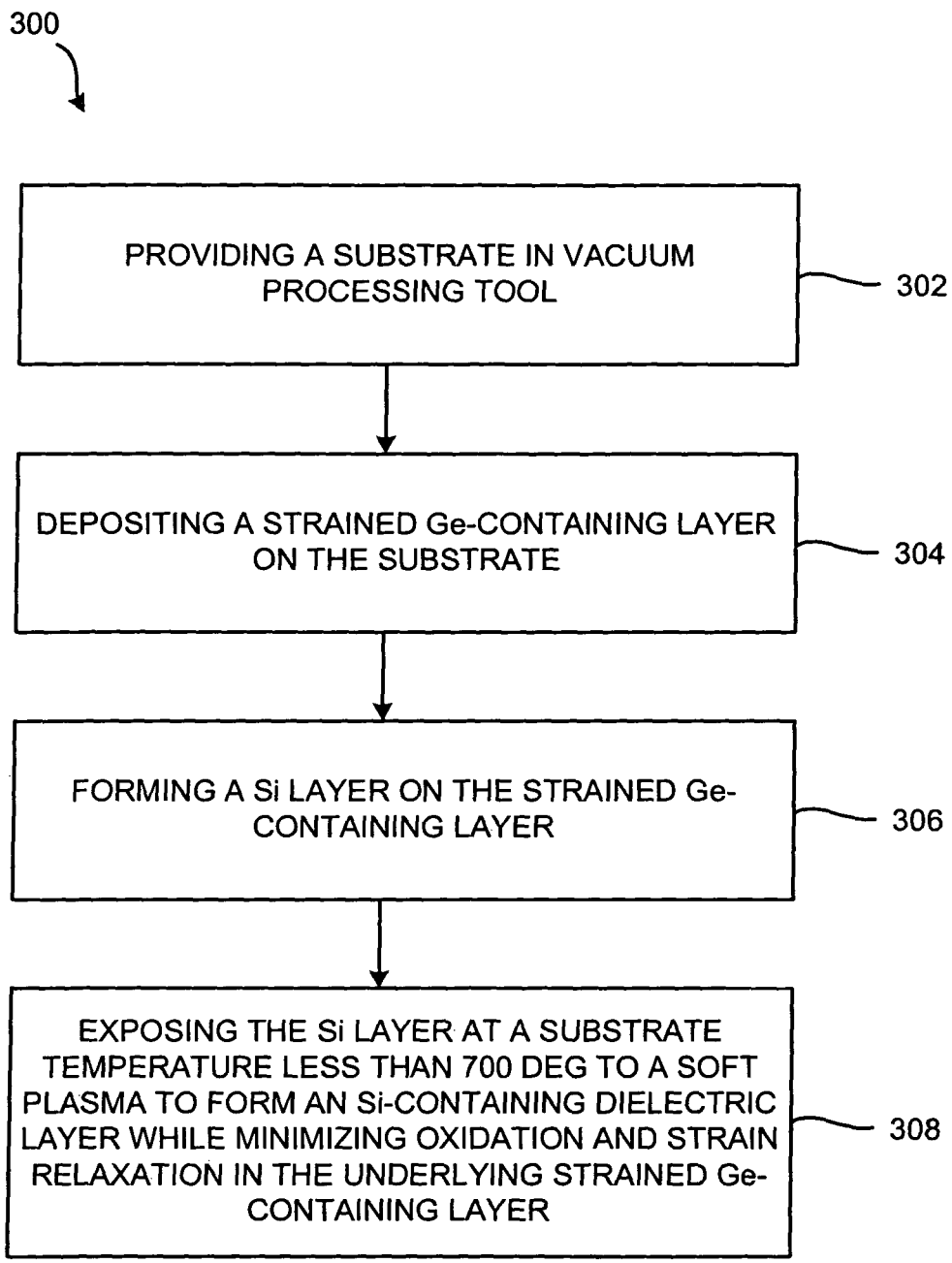
FIG. 3 is a process flow diagram for forming a semiconductor device containing a strained Ge-containing layer according to an embodiment of the invention.

FIG. 3 is a process flow diagram for forming a semiconductor device containing a strained Ge-containing layer according to an embodiment of the invention. Referring now to FIGS. 1 and 3, the process 300 includes, in step 302, providing a substrate 100 in a vacuum processing tool. According to one embodiment of the invention, the vacuum processing tool may be the vacuum processing tool 400 depicted in FIG. 4.

In step 304, a strained Ge-containing layer 102 is deposited onto the substrate 100. A strained SiGe layer 102 can, for example, be formed by chemical vapor deposition (CVD) using a reactant gas mixture containing a silicon-containing gas such as silane ($SiH_4$), disilane ($Si_2H_6$), dichlorosilane ($SiCl_2H_2$), or hexachlorodisilane ($Si_2Cl_6$), and a germanium-containing gas such as germane ($GeH_4$). A strained Ge layer 102 can, for example, be formed by CVD at a substrate temperature below 700° C. using a reactant gas containing GeH$_4$. Alternately, the strained Ge-containing layer 102 may be deposited by physical vapor deposition (PVD) methods.

In step 306, a Si layer 104 is formed on the strained Ge-containing layer 102. The Si layer 104 can, for example, be formed by CVD at a substrate temperature below 700° C. using a reactant gas containing a silicon-containing gas such as SiH$_4$, Si$_2$H$_6$, SiCl$_2$H$_2$, or Si$_2$Cl$_6$.

The strained Ge-containing layer 102 and the Si layer 104 can, for example, be deposited in a batch processing system configured to process about 100 substrates (wafers), or less. Alternately, a single wafer processing system may be utilized. The substrates can be of any size, for example 200 mm substrates, 300 mm substrates, or even larger substrates. Processing conditions used for depositing the strained Ge-containing layer 102 and the Si layer 104 can include a process chamber pressure less than about 100 Torr. By way of example only, in a batch processing system, the chamber pressure can be less than about 1 torr, for example about 0.3 Torr. By way of further example only, in a single wafer processing system, the chamber pressure can be in the range of about 1-20 Torr. Exemplary batch processing systems that may be utilized for depositing the strained Ge-containing layer 102 and the Si layer 104 are described in United States patent application Ser. No. 10/673,375, entitled "DEPOSITION OF SILICON-CONTAINING FILMS FROM HEXACHLORODISI-LANE," the entire content of which is herein incorporated by reference. While the embodiment of FIG. 3 shows deposition of the strained Ge-containing layer and forming of the Si layer, actual forming of these layers is not required for the present invention. However, forming these layers in the vacuum processing tool can minimize oxidation of these layers prior to exposure of the Si layer to the soft plasma to form the Si-containing dielectric layer.

According to another embodiment of the invention, a substrate containing a strained Ge-containing layer on the substrate may be provided into the vacuum processing tool, a Si layer formed on the strained Ge-containing layer, and the Si layer exposed to the soft plasma to form the Si-containing dielectric layer. In one example, any Ge-containing oxide formed on the strained Ge-containing layer by transferring of the substrate through air to the vacuum processing tool, may be removed in the vacuum processing tool prior to forming the Si layer on the strained Ge-containing layer. In one example, since Ge-containing oxides can be volatile at moderate temperatures, removal of the Ge-containing oxide portion of the strained Ge-containing layer may be performed by an annealing process.

According to yet another embodiment of the invention, a substrate containing a strained Ge-containing layer on the substrate and a Si layer on the strained Ge-containing layer may be provided into the vacuum processing tool, and the Si layer exposed to the soft plasma to form the Si-containing dielectric layer. In addition, any native oxide formed on the Si layer by transferring of the substrate through air to the vacuum processing tool may be removed prior to the exposure to the soft plasma. In one example, the native oxide removal may be performed by a chemical oxide removal (COR) process where the native oxide layer is exposed to a process gas comprising HF and NH$_3$ to form a chemically treated layer. Next, a desorption process is performed in order to remove the chemically treated layer. In another example, removal of any native oxide layer formed on the Si layer may be omitted prior to the exposure to the soft plasma.

Figure 5:
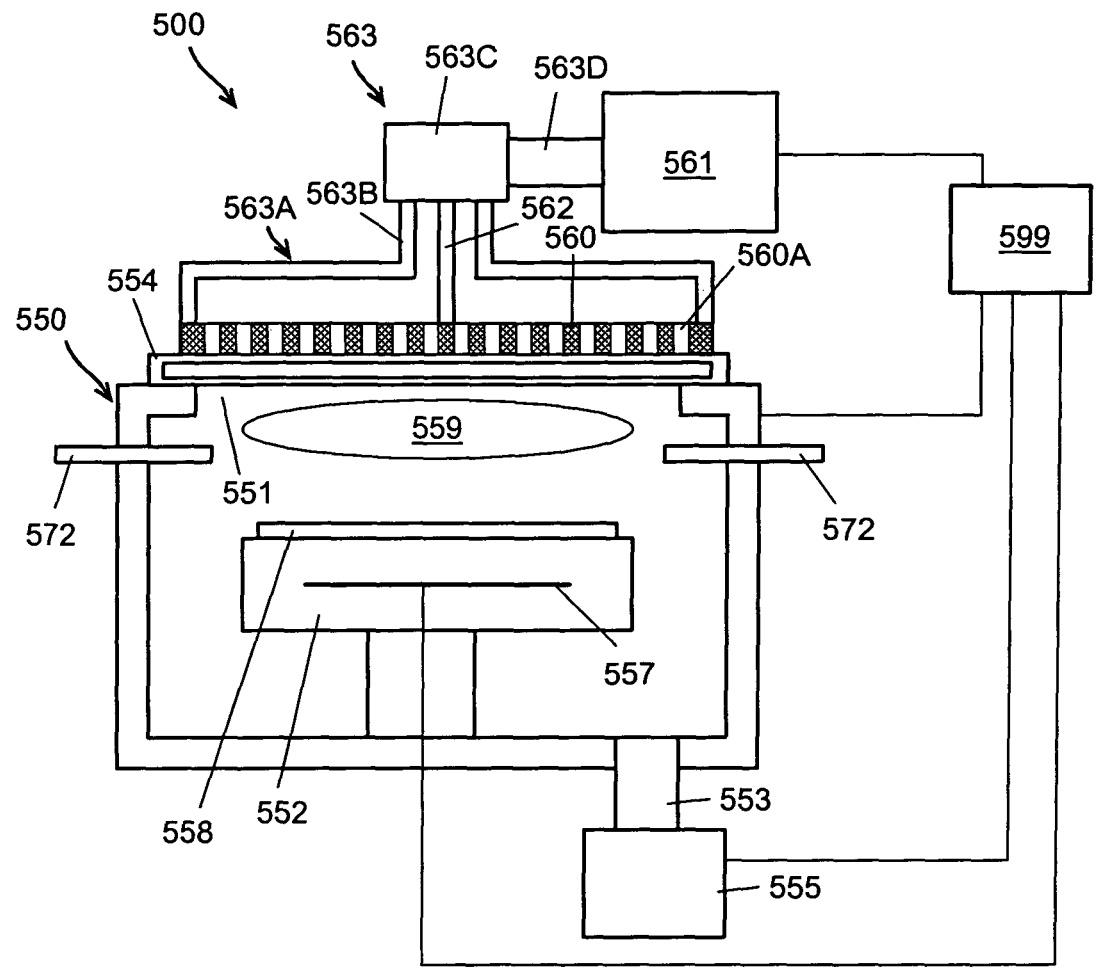
FIG. 5 schematically shows a plasma processing system containing a slot plane antenna for soft plasma exposure of a Si layer in semiconductor device containing a strained Ge-containing layer according to an embodiment of the invention.

As noted in the Background section above, conventional plasma oxidation processes can damage the underlying Ge-containing film. Such conventional oxidation plasmas are typically characterized by high electron temperature (T$_e$) and high plasma density or low electron temperature and low plasma density that requires long plasma exposure times. In step 308, the Si layer 104 is exposed to a high-density soft (low T$_e$) plasma 105 at a substrate temperature less than 700° C. The present inventors have recognized that such a plasma combining high-density characteristics with low electron temperature can provide time efficient oxidation and/or nitridation of the Si layer while minimizing the damage caused by high T$_e$ plasmas. The plasma exposure may be performed by a plasma processing system containing a slot plane antenna plasma source, such as that described in FIG. 5. The plasma processing system described in FIG. 5 is characterized by low electron temperature that is controllable between about 0.5 eV and about 6 eV and high plasma density between about $1\times10^{10}$/cm$^3$ and about $5\times10^{12}$/cm$^3$ that enables substantially damage-free oxidation and/or nitridation of the Si layer 104 overlying the strained Ge-containing layer 102. Further, the oxidation process avoids or minimizes oxidation and strain relaxation in the underlying strained Ge-containing layer 102.

According to one embodiment of the invention, the Si layer 104 is oxidized to form an oxide layer from a plasma excited process gas containing O$_2$ or H$_2$O and an inert gas such as Ar, Kr, He, or Xe. A flow rate of the O$_2$ or H$_2$O gas can be between 10 sccm and 500 sccm, and a flow rate of the inert gas can be between 500 sccm and 2000 sccm. The gas pressure in the process chamber can be between 20 mTorr and 200 mTorr. The substrate can be maintained at a temperature less than 700° C., for example between room temperature and less than 700° C., or between about 200° C. and about 500° C. In one example the substrate can be maintained at a temperature of about 500° C.

According to another embodiment of the invention, the Si layer 104 is oxidized to form an oxynitride layer from a plasma excited process gas containing N$_2$, O$_2$, and optionally an inert gas such as Ar, Kr, He, or Xe. A flow rate of the O$_2$ gas and the N$_2$ gas can be between 10 sccm and 500 sccm, and a flow rate of the inert gas can be between 500 sccm and 2000 sccm. The gas pressure in the process chamber can be between 20 mTorr and 2000 mTorr. The substrate can be maintained at a temperature less than 700° C., for example between room temperature and less than 700° C., or between about 200° C. and about 500° C. In one example the substrate can be maintained at a temperature of about 500° C. According to another embodiment of the invention, the process gas may contain NO, NO$_2$, or N$_2$O, or a combination thereof, and optionally an inert gas.

According to still another embodiment of the invention, the Si layer 104 is nitridized to form a nitride layer from a plasma excited process gas containing N$_2$ or NH$_3$ and optionally an inert gas such as Ar, Kr, He, or Xe. A flow rate of the N$_2$ gas can be between 10 sccm and 500 sccm, and a flow rate of the inert gas can be between 500 sccm and 2000 sccm. The gas pressure in the process chamber can be between 20 mTorr and 200 mTorr. The substrate can be maintained at a temperature less than 700° C., for example between room temperature and less than 700° C., or between about 200° C. and about 500° C. In one example the substrate can be maintained at a temperature of about 500° C.

According to yet another embodiment of the invention, the Si layer 104 is oxidized and nitridized to form an oxynitride layer in a sequential plasma process. For example, a SiO$_2$ layer may be first formed from a plasma excited process gas containing O$_2$, followed by exposure of the SiO$_2$ layer to a plasma excited process gas containing N$_2$. According to another embodiment of the invention, a SiN layer may be first formed from a plasma excited process gas containing N$_2$, followed by exposure of the SiN layer to a plasma excited process gas containing $O_2$. The two step process may be performed in the same processing system to minimize substrate contamination and increase throughput or, alternately, the two step process may be performed in different processing systems each configured for performing one of the two steps. The processing conditions described above for forming oxide and nitride layers may be utilized for performing the two step process for forming the oxynitride layer.

Figure 4:
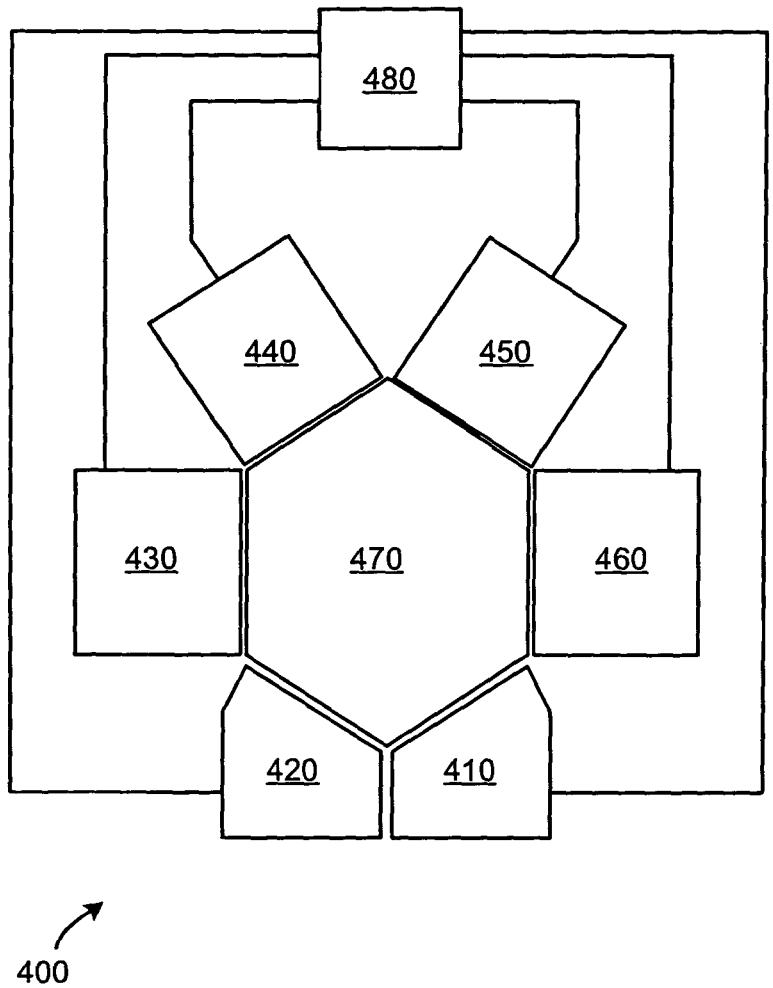
FIG. 4 schematically shows a vacuum processing tool for forming a semiconductor device according to an embodiment of the invention.

FIG. 4 schematically shows a vacuum processing tool for forming a semiconductor device according to an embodiment of the invention. The vacuum processing tool 400 contains substrate loading chambers 410 and 420, processing systems 430-460, robotic transfer system 470, and controller 480.

The substrate loading chambers 410 and 420 are utilized for transferring substrates into the vacuum processing tool 400 for processing, and out of the vacuum processing tool 400 following processing. Since the vacuum processing tool 400 is normally under vacuum, the substrate loading chambers 410 and 420 are configured to evacuate substrates disposed into the vacuum processing tool 400. As shown in FIG. 4, the substrate loading chambers 410 and 420 are coupled to the robotic transfer system 470. The robotic transfer system 470 is configured for transferring substrates between the substrate loading chambers 410 and 420 and the processing systems 430-460. The robotic transfer system 470 can, for example, be purged with an inert gas such as Ar under vacuum conditions (e.g., about 100 m Torr or less).

The processing system 430 can be configured for degassing and/or pre-cleaning. Degassing may be carried out following evacuation when the patterned substrate is disposed in the vacuum processing tool 400. The degassing can, for example, be performed by heating the substrate to a temperature between about 100° C. and about 500° C. in the presence of an inert gas such as Ar. Pre-cleaning may include light plasma cleaning of the substrate to remove any native oxide or other impurities from the surface of the substrate.

The processing system 440 can be configured for depositing a strained Ge-containing layer (e.g., Ge or SiGe) on the substrate by CVD, PVD, or atomic layer deposition (ALD). Furthermore, the processing system 440 may be configured for depositing a SiGe buffer layer on the substrate prior to depositing the strained Ge-containing layer. A SiGe buffer can be a thick relaxed SiGe layer. The processing system 450 can be configured for forming a Si layer on the strained Ge-containing layer. Alternately, the processing system 440 may be configured for depositing the strained Ge-containing layer and the Si layer. A processing system 460 is configured for forming the Si-containing dielectric layer by exposing the Si layer to a soft plasma. According to one embodiment of the invention, the processing system 460 can be a plasma processing system containing a slot plane antenna as described in FIG. 5. Alternately, the processing system 460 may be any plasma processing system capable of forming a soft plasma having low electron temperature. Although not shown, the vacuum processing tool 400 may also contain a substrate aligning system and a cool-down system configured for cooling processed substrates.

Following degassing and/or pre-cleaning in the processing system 430, the substrate is transported by the robotic transfer system 470 to the processing system 440 for depositing a strained Ge-containing layer. Next, the substrate is transported by the robotic transfer system 470 to the processing system 450 for depositing a Si layer onto the strained Ge-containing layer. Next, the substrate is transported by the robotic transfer system 470 to the processing system 460 for exposing the Si layer to a soft plasma. Thus, the vacuum processing tool 400 allows for performing the processing steps 302-308 of FIG. 3 without exposure to air during and between the steps 302-308. This enables formation of clean material layers with good control over interfaces between the different layers. Although not shown, the processing tool 400 may contain or be in vacuum connection with additional processing systems for further processing a substrate following the plasma process in step 308. For example, one or more processing systems may be configured for depositing a gate electrode layer and the high-k layer.

The vacuum processing tool 400 can be controlled by a controller 480. The controller 480 can be coupled to and exchange information with substrate loading chambers 410 and 420, processing systems 430-460, and robotic transfer system 470. The controller 480 can operate substrate transfer operations within the vacuum processing tool 400 and substrate processing performed within the processing systems 430-460. In one embodiment of the invention, the controller 480 can be programmed through a program stored in the memory of the controller 480 to perform processes of embodiments of the invention and any functions associated with monitoring the processes. The controller 480 may be a systems controller, a dedicated hardware circuit, a programmed general purpose computer, such as a DELL PRECISION WORKSTATION 610™, available from Dell Corporation, Austin, Tex.

FIG. 5 schematically shows a plasma processing system containing a slot plane antenna for soft plasma exposure of a Si layer in semiconductor device containing a strained Ge-containing layer according to an embodiment of the invention. The plasma produced in the plasma processing system 500 is characterized by low electron temperature, easily controllable between about 6 eV and about 0.5 eV, for example about 1.5 eV, and high plasma density, for example between $1 \times 10^{10}/cm^3$-$5 \times 10^{12}/cm^3$, that enables substantially damage-free oxidation of a Si layer overlying a strained Ge-containing layer according an embodiment of the invention. According to one embodiment of the invention, the plasma generated by the plasma processing system 500 can comprise electron temperatures between about 0.5 eV and about 2 eV and plasma densities between about $1 \times 10^{12}/cm^3$ and about $5 \times 10^{12}/cm^3$. The plasma processing system 500 can, for example, be a TRIAS™ SPA processing system, commercially available from Tokyo Electron Limited, Akasaka, Japan.

The plasma processing system 500 contains a process chamber 550 having an opening portion 551 in the upper portion of the process chamber 550 that is larger than a substrate 558. A cylindrical top plate 554 made of quartz, aluminum oxide, silicon, or aluminum nitride is provided to cover the opening portion 551. Gas lines 572 are located in the side wall of the upper portion of process chamber 550 below the top plate 554. In one example, the number of gas lines 572 can be 16 (only two of which are shown in FIG. 5). Alternately, a different number of gas feed lines 572 can be used. The gas lines 572 can be circumferentially arranged in the process chamber 550, but this is not required for embodiments of the invention. A process gas can be evenly and uniformly supplied into the plasma region 559 in process chamber 550 from the gas lines 572.

In the plasma processing system 500, microwave power is provided to the process chamber 550 through the top plate 554 via a plane antenna member 560 having a plurality of slots 560A. The slot plane antenna 560 can be made from a metal plate, for example copper. In order to supply the microwave power to the slot plane antenna 560, a waveguide 563 is disposed on the top plate 554, where the waveguide 563 is connected to a microwave power supply 561 for generating microwaves with a frequency of 2.45 GHz, for example. The microwave power output can be between 500 W and 2000 W, for example. The waveguide 563 contains a flat circular waveguide 563A with a lower end connected to the slot plane antenna 560, a circular (coaxial) waveguide 563B connected to the upper surface side of the circular waveguide 563A, and an output (bottom surface in FIG. 5) of a coaxial waveguide converter 563C connected to the upper surface side of the circular (coaxial) waveguide 563B. Furthermore, a rectangular waveguide 563D is connected to the input port (side surface in FIG. 5) of the coaxial waveguide converter 563C and the microwave power supply 561.

Inside the circular waveguide 563B, an axial portion 562 (or inner conductor) of an electro-conductive material is coaxially provided, so that one end of the axial portion 562 is connected to the central (or nearly central) portion of the upper surface of slot plane antenna 560, and the other end of the axial portion 562 is connected to the upper surface of the circular waveguide 563B, thereby forming a coaxial structure. As a result, the circular waveguide 563B is constituted so as to function as a coaxial waveguide. The microwave power can, for example, be between about 0.5 W/cm$^2$ and about 4 W/cm$^2$. Alternately, the microwave power can be between about 0.5 W/cm$^2$ and about 3 W/cm$^2$.

In addition, in the vacuum process chamber 550, a substrate holder 552 is provided opposite the top plate 554 for supporting and heating a substrate 558 (e.g., a wafer). The substrate holder 552 contains a heater 557 to heat the substrate 558, where the heater 557 can be a resistive heater. Alternately, the heater 557 may be a lamp heater or any other type of heater. Furthermore the process chamber 550 contains an exhaust line 553 connected to the bottom portion of the process chamber 550 and to a vacuum pump 555.

Still referring to FIG. 5, a controller 599 includes a microprocessor, a memory, and a digital I/O port capable of generating control voltages sufficient to communicate and activate inputs of the plasma processing system 500 as well as monitor outputs from the plasma processing system 500. Moreover, the controller 599 is coupled to and exchanges information with process chamber 550, the pump 555, the heater 557, and the microwave power supply 561. A program stored in the memory is utilized to control the aforementioned components of plasma processing system 500 according to a stored process recipe. One example of processing system controller 599 is a UNIX-based workstation. Alternately, the controller 599 can be implemented as a general-purpose computer, digital signal processing system, or any of the controllers described herein. Moreover, the controller 599 may be locally located relative to the plasma processing system 500 or it may be remotely located relative to the plasma processing system 500 via an internet or intranet. For additional details, a plasma process system having a slotted plane antenna (SPA) plasma source is described in co-pending European Patent Application EP1361605A1, titled "METHOD FOR PRODUCING MATERIAL OF ELECTRONIC DEVICE," the entire contents of which is hereby incorporated by reference.

It should be understood that various modifications and variations of the present invention may be employed in practicing the invention. It is therefore to be understood that, within the scope of the appended claims, the invention may be practiced otherwise than as specifically described herein.

What is claimed is:

1. A method of forming a semiconductor device, comprising:
   providing a substrate in a vacuum processing tool, the substrate having a strained Ge-containing layer on the substrate and a Si layer on the strained Ge-containing layer;
   maintaining the substrate at a temperature less than 700° C.;
   generating a soft plasma in the vacuum processing tool; and
   exposing the Si layer to the soft plasma to form a Si-containing dielectric layer while minimizing oxidation and strain relaxation in the strained Ge-containing layer.

2. The method according to claim 1, wherein the providing comprises:
   depositing a strained Ge-containing layer on the substrate; and
   forming a Si layer on the strained Ge-containing layer, wherein
   one or both of the depositing and the forming is performed in the vacuum processing tool.

3. The method according to claim 1, wherein the exposing comprises forming a Si-containing dielectric layer comprising a SiO$_2$ layer, a SiON layer, or a SiN layer, or a combination of two or more thereof.

4. The method according to claim 1, wherein the exposing comprises generating the soft plasma by microwave irradiation from a slot plane antenna plasma source having a plurality of slots.

5. The method according to claim 4, wherein the exposing comprises generating a soft plasma comprising electron temperatures between about 0.5 eV and about 6 eV and plasma densities between about 1×10$^{10}$/cm$^3$ and about 5×10$^{12}$/cm$^3$.

6. The method according to claim 4, wherein the exposing comprises generating a soft plasma comprising electron temperatures between about 0.5 eV and about 2 eV and plasma densities between about 1×10$^{12}$/cm$^3$ and about 5×10$^{12}$/cm$^3$.

7. The method according to claim 2,
   wherein the forming comprises forming a Si layer having a thickness between about 0.3 nm and about 2 nm; and
   wherein the exposing comprises forming a SiO$_2$, SiON, or SiN layer having a thickness between about 0.3 nm and about 2 nm.

8. The method according to claim 2,
   wherein the forming comprises forming a Si layer having a thickness between about 0.5 nm and about 1 nm; and
   wherein the exposing comprises forming a SiO$_2$, SiON, or SiN layer having a thickness between about 0.5 nm and about 1 nm.

9. The method according to claim 1, wherein the exposing comprises exposing the Si layer to a soft plasma formed from a process gas containing O$_2$, H$_2$O, N$_2$, NH$_3$, NO, NO$_2$, or N$_2$O, or a combination thereof.

10. The method according to claim 1, wherein the exposing comprises sequentially exposing the Si layer to a soft plasma formed from a first process gas containing O$_2$ and a soft plasma from a second process gas containing N$_2$.

11. The method according to claim 1, further comprising forming a gate electrode layer on the Si-containing dielectric layer, the gate electrode layer comprising poly Si, W, WN, WSi$_x$, Al, Mo, Ta, TaN, TaSiN, HfN, HfSiN, Ti, TiN, TiSiN, Mo, MoN, Re, Pt, or Ru.

12. The method according to claim 1, further comprising:
   forming a high-k dielectric layer on the Si-containing dielectric layer wherein the high-k dielectric layer comprises Ta$_2$O$_5$, TiO$_2$, ZrO$_2$, Al$_2$O$_3$, Y$_2$O$_3$, HfSiO$_x$, HfO$_2$, ZrO$_2$, ZrSiOx, TaSiO$_x$, SrO$_x$, SrSiO$_x$, LaO$_x$, LaSiO$_x$, YO$_x$, or YSiO$_x$, or combinations of two or more thereof and forming a gate electrode layer on the high-k dielectric layer wherein the gate electrode layer comprises poly Si, W, WN, $WSi_x$, Al, Mo, Ta, TaN, TaSiN, HfN, HfSiN, Ti, TiN, TiSiN, Mo, MoN, Re, Pt, or Ru.

13. The method according to claim 1, wherein the exposing comprises oxidizing or nitridizing only a portion of the Si layer.

14. A method of forming a semiconductor device, comprising:
providing a substrate in a vacuum processing tool;
depositing a strained Ge-containing layer on the substrate;
forming a Si layer on the strained Ge-containing layer; and
exposing the Si layer to a soft plasma at a substrate temperature less than 700° C., wherein the soft plasma comprises electron temperatures between about 0.5 eV and about 6 eV and plasma densities between about $1\times10^{10}/cm^3$ and about $5\times10^{12}/cm^3$ and is generated by microwave irradiation from a slot plane antenna plasma source comprising a plurality of slots.

* * * * *